US009584123B2

(12) United States Patent
Rai et al.

(10) Patent No.: US 9,584,123 B2
(45) Date of Patent: Feb. 28, 2017

(54) SYSTEMS AND METHODS FOR VOLTAGE LEVEL SHIFTING IN A DEVICE

(71) Applicant: LSI Corporation, San Jose, CA (US)

(72) Inventors: Dharmendra Kumar Rai, Bangalore (IN); Disha Singh, Bangalore (IN)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 14/211,084

(22) Filed: Mar. 14, 2014

(65) Prior Publication Data

US 2015/0263732 A1    Sep. 17, 2015

(51) Int. Cl.
$H03K$ $19/0175$    (2006.01)
$H03K$ $19/0948$    (2006.01)
$H03K$ $19/0944$    (2006.01)
$H03K$ $19/00$    (2006.01)

(52) U.S. Cl.
CPC . *H03K 19/017509* (2013.01); *H03K 19/0013* (2013.01); *H03K 19/0944* (2013.01); *H03K 19/0948* (2013.01)

(58) Field of Classification Search
CPC ......... G09G 2310/0289; G09G 3/3685; H03K 19/018507; H03K 19/018521

USPC ...................................... 326/62–81; 327/333
See application file for complete search history.

(56) References Cited

U.S. PATENT DOCUMENTS

| | | | |
|---|---|---|---|
| 6,335,893 B1* | 1/2002 | Tanaka | G11C 5/145 |
| | | | 257/E27.097 |
| 8,581,627 B2 | 11/2013 | Panov | |
| 8,614,700 B2 | 12/2013 | Yu | |
| 2013/0300486 A1 | 11/2013 | Kumar | |

* cited by examiner

*Primary Examiner* — Alexander H Taningco
*Assistant Examiner* — Seokjin Kim

(57) ABSTRACT

Level shifters are disclosed for high performance sub-micron IC designs. One embodiment is a level shifting device that comprises a first input circuit that toggles a first internal signal between a logical zero of a first voltage range and a logical one of a second voltage range based on an input data signal and an output data signal, and a second input circuit that toggles a second internal signal between a logical zero of the second voltage range and a logical one of the first voltage range based on the input data signal and the output data signal. An output circuit of the device toggles the output data signal between a logical zero of the second voltage range and a logical one of the second voltage range based on the first internal signal, the second internal signal, and a compliment of the input data signal.

20 Claims, 5 Drawing Sheets

SYSTEMS AND METHODS FOR VOLTAGE LEVEL SHIFTING IN A DEVICE

FIELD OF THE INVENTION

The invention generally relates to field of level shifters that translate logic level signals between voltage ranges.

BACKGROUND

Sub-micron Integrated Circuit (IC) designs often utilize a number of different power supplies to reduce power consumption and to improve performance. For example, in sub-micron Static Random Access Memories (SRAM) devices, higher voltage supplies may be utilized for the memory cells to improve the process yield, while peripheral circuits to the memory cells may utilize lower voltage supplies to reduce the power consumption of the SRAM device. Level shifters are used to translate the logic level signals between the different voltage supplies in the SRAM device. However, conventional level shifters may have issues with reliability, delay, and power consumption, which reduces the performance of sub-micron IC's, including SRAM devices.

SUMMARY

Level shifters are disclosed for high performance sub-micron IC designs. One embodiment comprises a level shifting device for translating a logic level input data signal having a first voltage range to a logic level output data signal having a second voltage range. The level shifting device comprises a first input circuit configured to toggle a first internal signal between a logical zero of the first voltage range and a logical one of the second voltage range based on the input data signal and the output data signal. The level shifting device further comprises a second input circuit configured to toggle a second internal signal between a logical zero of the second voltage range and a logical one of the first voltage range based on the input data signal and the output data signal. The level shifting device further comprises an output circuit configured to toggle the output data signal between a logical zero of the second voltage range and a logical one of the second voltage range based on the first internal signal, the second internal signal, and a compliment of the input data signal.

The various embodiments disclosed herein may be implemented in a variety of ways as a matter of design choice. For example, some embodiments herein are implemented in hardware whereas other embodiments may include processes that are operable to construct and/or operate the hardware. Other exemplary embodiments are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
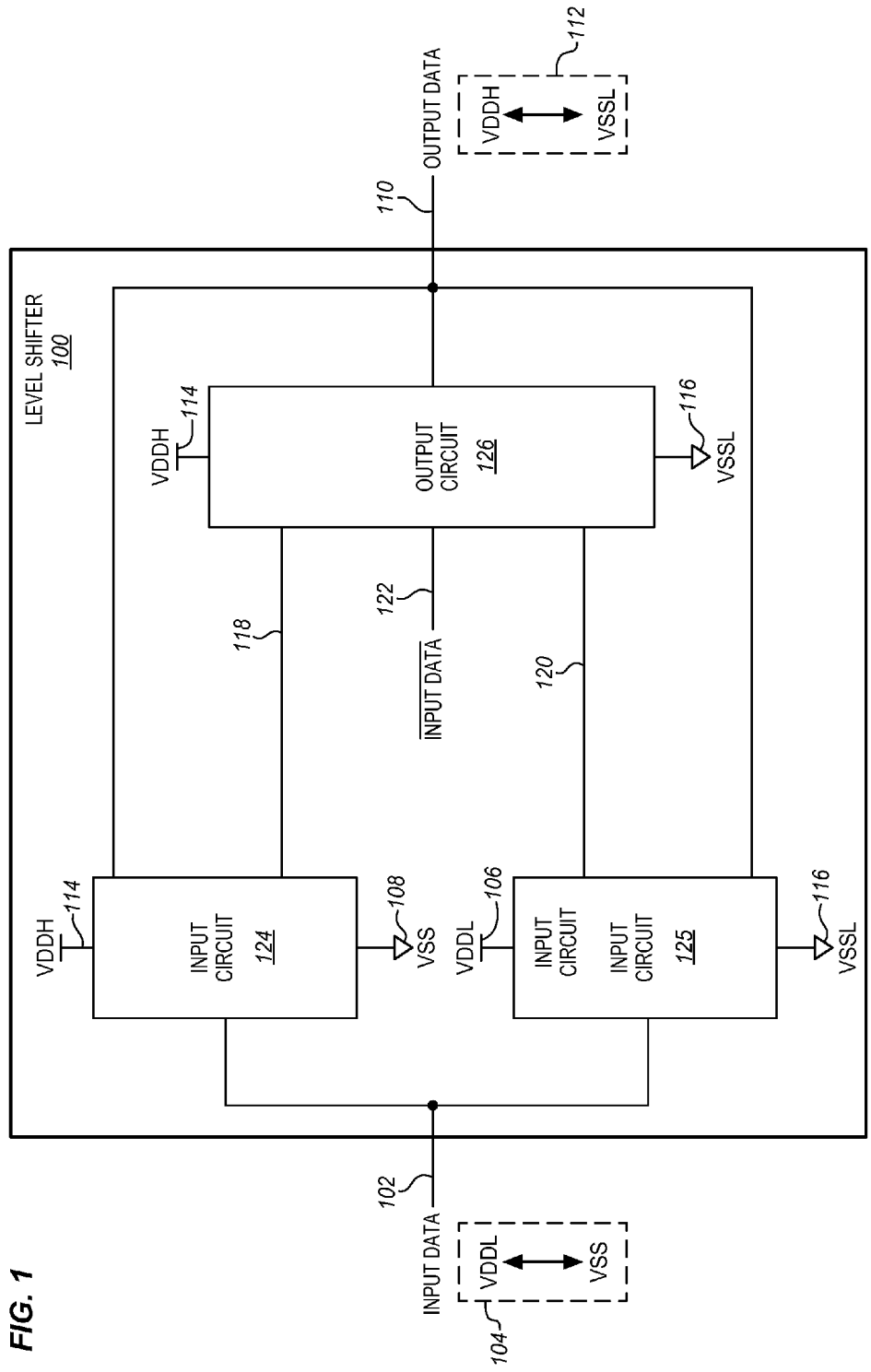
FIG. 1 is a block diagram of an exemplary level shifter.

FIG. 1 is a block diagram of an exemplary level shifter 100. Generally, level shifter 100 translates logic level signals from one voltage range to another voltage range. In this embodiment, level shifter 100 translates an input data signal 102 having an input voltage range 104 to an output data signal 110 having an output voltage range 112. Input data signal 102 switches between a logical one at voltage VDDL 106 and a logical zero at voltage VSS 108 during logic transitions, while output data signal 110 switches between a logical one at voltage VDDH 114 and a logical zero at voltage VSSL 116 during logic transitions. In this embodiment, VDDL 106 is less than VDDH 114, so level shifter 100 in this embodiment converts logic level signals from a lower voltage to a higher voltage. For example, level shifter 100 may convert 0-800 mv logic to 0-1.5V logic as signals are routed from low voltage control circuitry to higher voltage SRAM cells in an SRAM device. Further, it is not necessary that input voltage range 104 and output voltage range 112 utilize the same ground reference for level shifter 100 for signal translations. Thus, VSS 108 and VSSL 116 may be at different voltages. For example, VSSL 116 may be less than VSS 108.

In this embodiment, level shifter 100 includes a pair of input circuits 124 and 125 and an output circuit 126. Input circuit 124 is coupled to VDDH 114 and VSS 108, and toggles an internal signal 118 that is used by output circuit 126 for signal translations from input voltage range 104 to output voltage range 112. In particular, input circuit 124 includes any component or device that is able to toggle internal signal 118 based on input data signal 102 and output data signal 110. For example, input circuit 124 may toggle internal signal 118 between VSS 108, a logical zero for input data signal 102, and VDDH 114, a logical one for output data signal 110.

Input circuit 125 of level shifter 100 is coupled to VDDL 106 and VSSL 116, and toggles an internal signal 120 that is also used by output circuit 126 for signal translations from input voltage range 104 to output voltage range 112. In particular, input circuit 125 includes any component or device that is able to toggle internal signal 120 based on input data signal 102 and output data signal 110. For example, input circuit 125 may toggle internal signal 120 between VSSL 116, a logical zero for output data signal 110, and VDDL 106, a logical one for input data signal 102.

Output circuit 126 of level shifter 100 is coupled to VDDH 114 and VSSL 116, and performs signal translations from input voltage range 104 to output voltage range 112. In particular, output circuit 126 includes any component or device that is able to toggle output data signal 110 based on internal signal 118 generated by input circuit 124, internal signal 120 generated by input circuit 125, and a compliment 122 of input data signal 102. Compliment 122 is a logically inverted version of input data signal 102. For example, output circuit 126 may toggle output data signal 110 between VDDH 114, a logical one for output data signal 110, and VSSL 116, a logical zero for output data signal 110.

Figure 2:
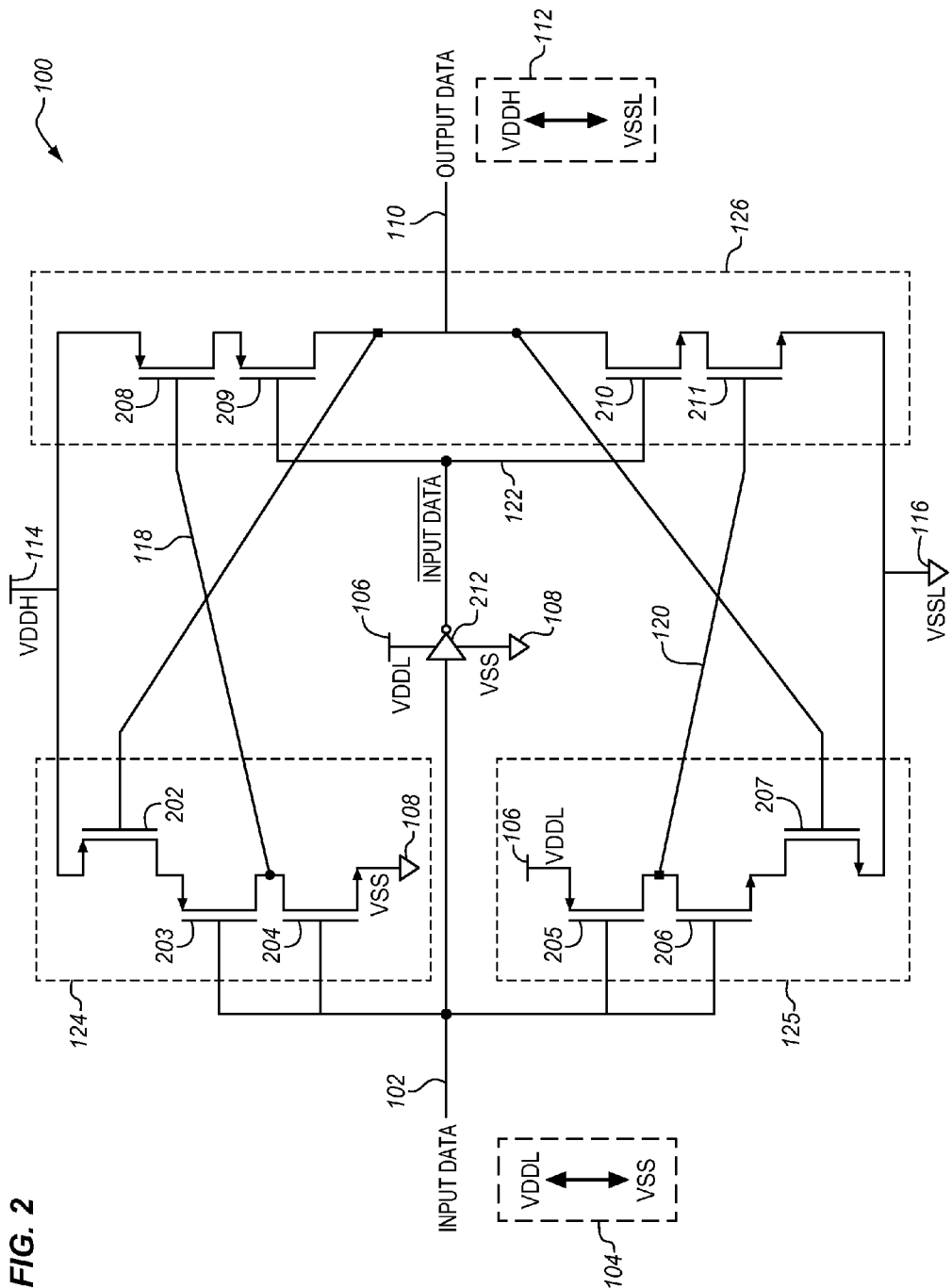
FIG. 2 is a schematic diagram of the level shifter of FIG. 1 in an exemplary embodiment.

FIG. 2 is a schematic diagram of level shifter 100 of FIG. 1 in an exemplary embodiment. In this embodiment, a number of Field-Effect Transistors (FETs) 202-211 are illustrated in a particular configuration for implementing the functionality previously described for level shifter 100 of FIG. 1. Generally, FETs 202-211 may include any type of field-effect transistor as a matter of design choice. One example of a FET is a Metal Oxide Semiconductor Field Effect Transistor (MOSFET). Although FIG. 2 illustrates one configuration of a number of FETs, one skilled in the art will understand other configurations may be implemented as a matter of design choice. Thus, it is not intended that level shifter 100 be limited to only the configuration and types of FETs 202-211 illustrated in FIG. 2.

FIG. 2 illustrates that FETs 202-204 are utilized in this embodiment to implement input circuit 124. FET 202 is a P-channel device that has a source terminal coupled to VDDH 114, a gate terminal coupled to output data signal 110, and a drain terminal coupled to the source terminal of FET 203. FET 203 is another P-channel device that has a gate terminal coupled to input data signal 102 and a drain terminal coupled to internal signal 118. FET 204 is an N-channel device that has a drain terminal coupled to internal signal 118, a gate terminal coupled to input data signal 102, and a source terminal coupled to VSS 108.

FIG. 2 further illustrates that FETs 205-207 are utilized in this embodiment to implement input circuit 125. FET 205 is a P-channel device that has a source terminal coupled to VDDL 106, a gate terminal coupled to input data signal 102, and a drain terminal coupled to internal signal 120. FET 206 is an N-channel device that has a drain terminal coupled to internal signal 120, a gate terminal coupled to input data signal 102, and a source terminal coupled to the drain terminal of FET 207. FET 207 is another N-channel device that has a gate terminal coupled to output data signal 110 and a source terminal coupled to VSSL 116.

FIG. 2 further illustrates that FETs 208-211 are utilized in this embodiment to implement output circuit 126. FET 208 is a P-channel device that has a source terminal coupled to VDDH 114, a gate terminal coupled to internal signal 118, and a drain terminal coupled to the source terminal of FET 209. FET 209 is another P-channel device that has a gate terminal coupled to compliment 122 of input data signal 102, and a drain terminal coupled to output data signal 110. In this embodiment, compliment 122 of input data signal 102 is generated by an inverting driver 212 coupled to VDDL 106 and VSS 108, although how compliment 122 of input data signal 102 is generated is a matter of design choice. FET 210 of output circuit 126 has a drain terminal coupled to output data signal 110, a gate terminal coupled to compliment 122 of input data signal 102, and a source terminal coupled to the drain terminal of FET 211. FET 211 is an N-channel device that has a gate terminal coupled to internal signal 120 and a source terminal coupled to VSSL 116.

During operation of the circuits illustrated in FIG. 2, input data signal 102 switches between VDDL 106 and VSS 108 and output data signal 110 switches between VDDH 114 and VSSL 116. For the following discussion of operation, it will be assumed that all P-channel devices have a body or bulk connection to VDDH 114, and all N-channel devices have a body or bulk connection to VSSL 116, although other configurations may exist.

When input data signal 102 is at a logical zero, the voltage of input data signal 102 is approximately VSS 108. When input data signal 102 is at a logical one, the voltage of input data signal 102 is approximately VDDL 106. Further, when output data signal 110 is at a logical zero, the voltage of output data signal 110 is approximately VSSL 116. When output data signal 110 is at a logical one, the voltage of output data signal 110 is approximately VDDH 114. This convention is positive logic and will be used throughout the subsequent discussion.

Consider the following steady state case when input data signal 102 is at a logical zero. With input data signal 102 at a logical zero, compliment 122 is at a logical one, or VDDL 106. For input circuit 125, FET 205 is on and internal signal 120 is at VDDL 106, which turns on FET 211. With compliment 122 high and FET 211 on, FET 210 is also on. This pulls output data signal 110 to VSSL 116, which is a logical zero for output data signal 110.

With input data signal 102 at a logical zero and output data signal 110 at a logical zero, FETs 202-303 are both on. Internal signal 118 is at VDDH 114, which turns off FET 208 and disconnects VDDH 114 from output data signal 110. FET 209 may be off or partially conducting based on the voltage difference between VDDL 106 and VDDH 114, since the body or bulk connection to FET 209 is tied to VDDH 114. With FET 208 off and FET 209 off or partially off, the leakage current from VDDH 114 to VSSL 116 is low while output data signal 110 is at a logical zero.

Consider the following case when input data signal 102 transitions from a logical zero to a logical one. As input data signal 102 transitions from a logical zero to a logical one, FET 204 turns on to couple internal signal 118 to VSS 108 and FET 203 turns off to decouple internal signal 118 from VDDH 114. This rapidly discharges internal signal 118 to VSS 108 and turns on FET 208. With input data signal 102 transitioning to a logical one, compliment 122 transitions to a logical zero. This turns on FET 209 and output data signal 110 starts charging towards VDDH 114. With compliment 122 transitioning to a logical zero, FET 210 turns off and decouples output data signal 110 from VSSL 116. This reduces the shoot through current from VDDH 114 to VSSL 116 during switching, and also reduces the charging time for output data signal 110. With output data signal 110 charging towards VDDH 114, FET 207 turns on. FET 206 is on and FET 205 is off due to input data signal 102 at a logical one, so internal signal 120 discharges to VSSL 116. This turns off FET 211. With FETs 210-211 off and stacked in series, the leakage current from VDDH 114 to VSSL 116 is reduced. FET 203 may be off or partially conducting based on the voltage difference between VDDL 106 and VDDH 114, since the body or bulk connection to FET 203 is tied to VDDH 114. However, FET 202 is off, which reduces the leakage current from VDDH 114 to VSS 108. Further, no direct leakage path exists between VDDH 114 and VDDL 106.

Figure 3:
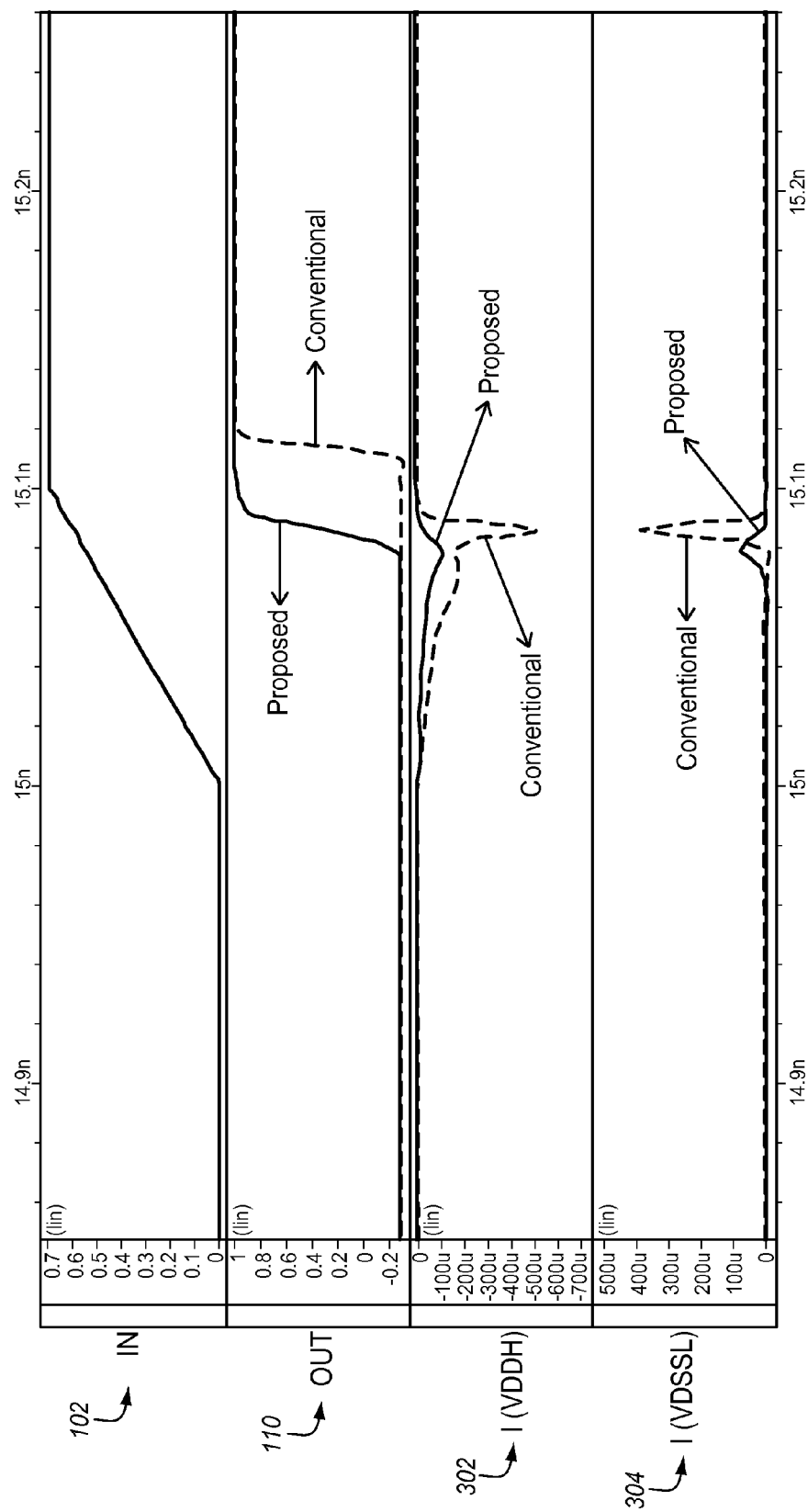
FIG. 3 illustrates a low to high logic transition timing simulation for the level shifter of FIG. 2 in an exemplary embodiment.

FIG. 3 illustrates a low to high logic transition timing simulation for level shifter 100 of FIG. 2 in an exemplary embodiment. Input data signal 102 indicates a transition from a logical zero to a logical one in FIG. 3. Output data signal 110 indicates a reduced delay for the circuits illustrated in FIG. 2 in comparison to a conventional level shifting circuit. A current waveform 302 for VDDH 114 and a current waveform 304 for VSSL 116 indicate a reduced shoot through current during switching for the circuits illustrated in FIG. 2 in comparison to a conventional level shifting circuit.

Consider the following case when input data signal 102 transitions from a logical one to a logical zero. As input data signal 102 transitions from a logical one to a logical zero, FET 205 turns on to coupled internal signal 120 to VDDL 106 and FET 206 turns off to decouple internal signal 120 from VSSL 116. This rapidly charges internal signal 120 to VDDL 106 and turns on FET 211. With input data signal 102 transitioning to a logical zero, compliment 122 transitions to a logical one. This turns on FET 210 and output data signal 110 starts discharging towards VSSL 116. With compliment 122 transitioning to a logical one, FET 209 turns off and decouples output data signal 110 from VDDH 114. This reduces the shoot through current from VDDH 114 to VSSL 116 during switching, and also reduces the discharge time for output data signal 110. With output data signal 110 discharging towards VSSL 116, FET 202 turns on. FET 203 is on and FET 204 is off due to input data signal 102 at a logical zero, so internal signal 118 charges to VDDH 114. This turns off FET 208. With FETs 208-209 off and stacked in series, the leakage current from VDDH 114 to VSSL 116 is reduced. FET 206 may be off or partially conducting based on the voltage difference between VSS 108 and VSSL 116, since the body or bulk connection to FET 206 is tied to VSSL 116. However, FET 207 is off, which reduces the leakage current from VDDL 106 to VSSL 116. Further, no direct leakage path exists between VSSL 116 and VSS 108.

Figure 4:
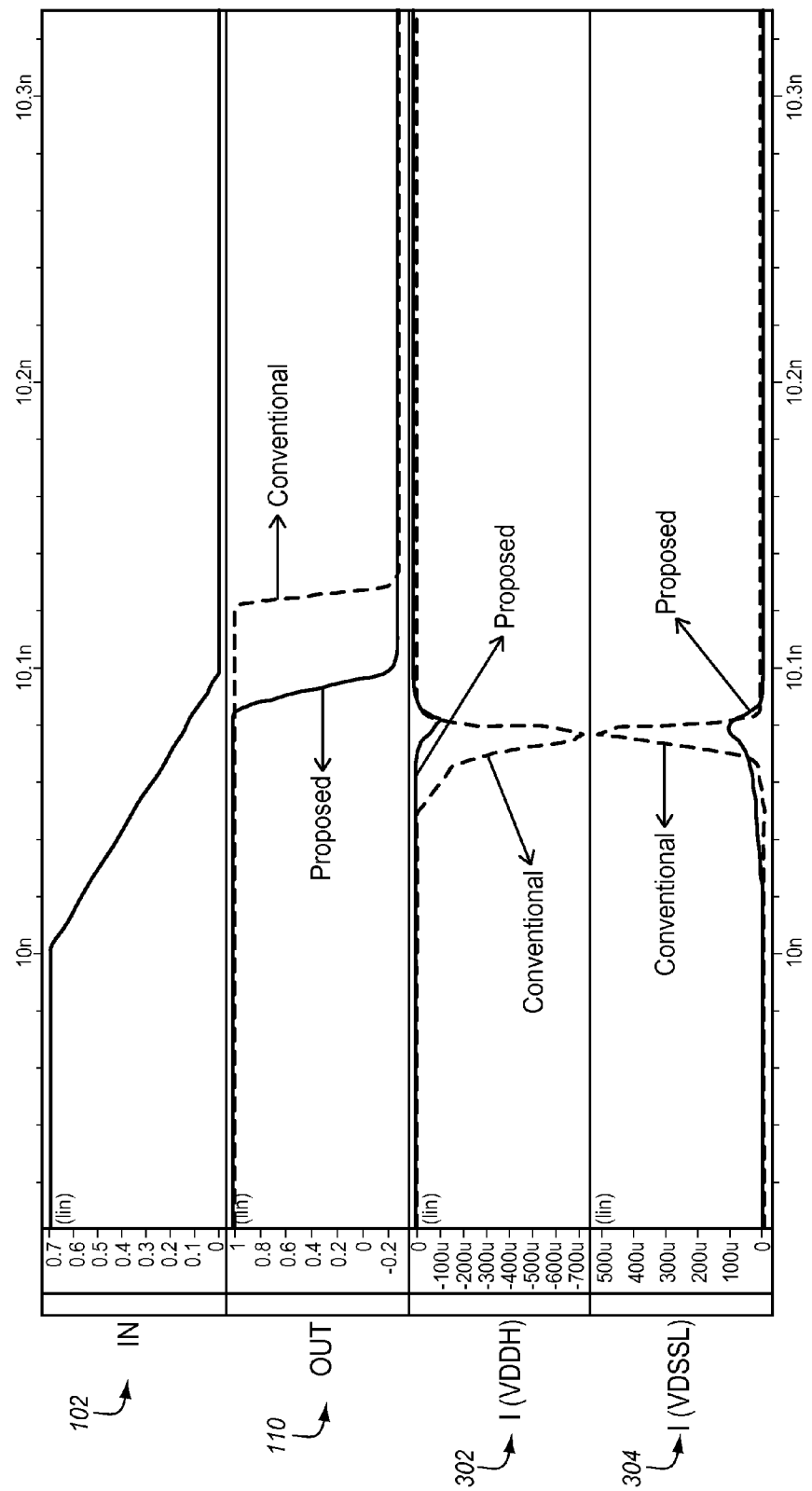
FIG. 4 illustrates a high to low logic transition timing simulation for the level shifter of FIG. 2 in an exemplary embodiment.

FIG. 4 illustrates a high to low logic transition timing simulation for level shifter 100 of FIG. 2 in an exemplary embodiment. Input data signal 102 indicates a transition from a logical one to a logical zero in FIG. 4. Output data signal 110 indicates a reduced delay for the circuits illustrated in FIG. 2 in comparison to a conventional level shifting circuit. Current waveforms 302 and 304 for VDDH 114 and VSSL 116, respectively, indicate a reduced shoot through current during switching for the circuits illustrated in FIG. 2 in comparison to a conventional level shifting circuit.

Figure 5:
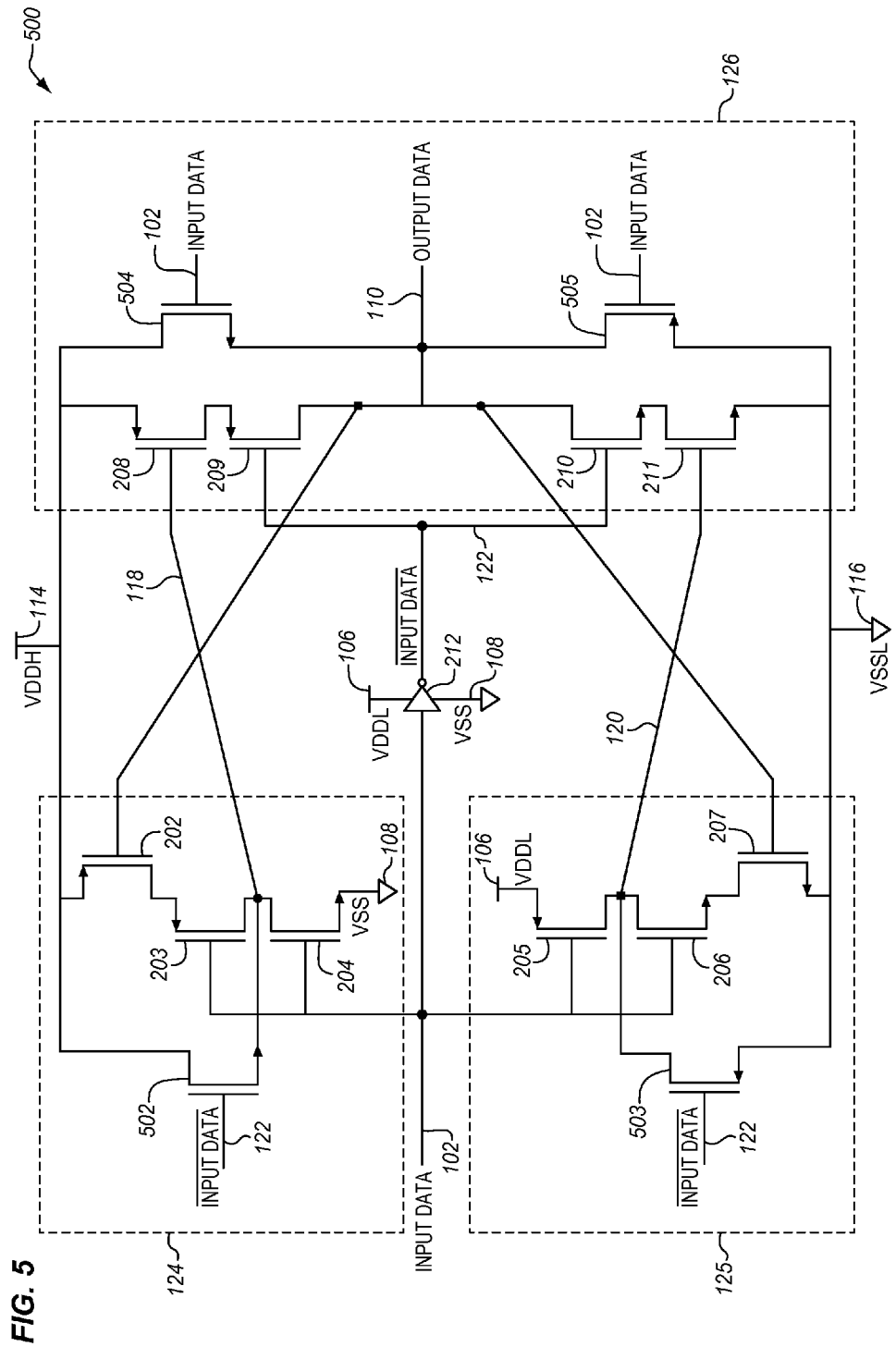
FIG. 5 illustrates a schematic diagram of the level shifter of FIG. 1 in another exemplary embodiment.

FIG. 5 illustrates a schematic diagram of level shifter 100 in another exemplary embodiment. In this embodiment, an N-channel FET 502 has been added to input circuit 124 to improve the charging time for internal signal 118 when input data signal 102 is transitioning from a logical one to a logical zero. This turns off FET 208 faster and allows output data signal 110 to be decoupled from VDDH 114 more quickly. FET 502 has a drain terminal coupled to VDDH 114, a gate terminal coupled to compliment 122, and a source terminal coupled to internal signal 118. The bulk/body connection for FET 502 is VSSL 116.

In this embodiment, a P-channel FET 503 has been added to input circuit 125 to improve the discharge time for internal signal 120 when input data signal 102 is transitioning from a logical zero to a logical one. This turns off FET 211 faster and allows output data signal 110 to decouple from VSSL 116 more quickly. FET 503 has a drain terminal coupled to internal signal 120, a gate terminal coupled to compliment 122, and a source terminal coupled to VSSL 116. The bulk/body connection for FET 503 is VDDH 114.

In this embodiment, an N-channel FET 504 has been added to output circuit 126 to improve the charging time for output data signal 110 when input data signal 102 is transitioning from a logical zero to a logical one by allowing FET 504 to source current from VDDH 114 to charge output data signal 110. FET 504 has a drain terminal coupled to VDDH 114, a gate terminal coupled to input data signal 102, and a source terminal coupled to output data signal 110. The bulk/body connection for FET 504 is VSSL 116.

In this embodiment, a P-channel FET 505 has been added to output circuit 126 to improve the discharge time for output data signal 110 when input data signal 102 is transitioning from a logical one to a logical zero. FET 505 has a drain terminal coupled to output data signal 110, a gate terminal coupled to input data signal 102, and a source terminal coupled to VSSL 116. The bulk/body connection for FET 505 is VDDH 114.

What is claimed is:

1. A level shifting device for translating a logic level input data signal having a first voltage range to a logic level output data signal having a second voltage range, the level shifting device comprising:
a first input circuit configured to toggle, based on the input data signal and the output data signal, a first internal signal between a logical zero of the first voltage range and a logical one of the second voltage range;
a second input circuit configured to toggle, based on the input data signal and the output data signal, a second internal signal between a logical zero of the second voltage range and a logical one of the first voltage range; and
an output circuit configured to toggle, based on the first internal signal, the second internal signal, and a compliment of the input data signal, the output data signal between a logical zero of the second voltage range and a logical one of the second voltage range.

2. The level shifting device of claim 1 wherein:
the first voltage range comprises a first supply having a first logical one reference voltage and a first logical zero reference voltage;
the second voltage range comprises a second supply having a second logical one reference voltage and a second logical zero reference voltage;
the first input circuit is coupled to the second logical one reference voltage and to the first logical zero reference voltage;
the second input circuit is coupled to the first logical one reference voltage and the second logical zero reference voltage; and
the output circuit is coupled to the second logical one reference voltage and the second logical zero reference voltage.

3. The level shifting device of claim 2 wherein the first input circuit comprises:
a first field-effect transistor (FET) having a source terminal coupled to the first logical zero reference voltage, a gate terminal coupled to the input data signal, and a drain terminal coupled to the first internal signal;
a second FET having a source terminal, a gate terminal coupled to the input data signal, and a drain terminal coupled to the first internal signal; and
a third FET having a source terminal coupled to the second logical one reference voltage, a gate terminal coupled to the output data signal, and a drain terminal coupled to the source terminal of the second FET.

4. The level shifting device of claim 3 wherein:
the first FET comprises an N-channel FET; and
the second FET and the third FET comprise P-channel FETs.

5. The level shifting device of claim 3 wherein the first input circuit further comprises:
a fourth FET having a source terminal coupled to the first internal signal, a gate terminal coupled to the compliment of the input data signal, and a drain terminal coupled to the second logical one reference voltage.

6. The level shifting device of claim 5 wherein:
the fourth FET comprises an N-channel FET.

7. The level shifting device of claim 2 wherein the second input circuit comprises:
a first field-effect transistor (FET) having a source terminal coupled to the second logical zero reference voltage, a gate terminal coupled to the output data signal, and a drain terminal;
a second FET having a source terminal coupled to the drain terminal of the first FET, a gate terminal coupled to the input data signal, and a drain terminal coupled to the second internal signal; and
a third FET having a source terminal coupled to the first logical one reference voltage, a gate terminal coupled to the input data signal, and a drain terminal coupled to the second internal signal.

8. The level shifting device of claim 7 wherein:
the first FET and the second FET comprise N-channel FETs; and
the third FET comprises a P-channel FET.

9. The level shifting device of claim 7 wherein the second input circuit further comprises:
a fourth FET having a source terminal coupled to the second logical zero reference voltage, a gate terminal coupled to the compliment of the input data signal, and a drain coupled to the second internal signal.

10. The level shifting device of claim 9 wherein:
the fourth FET comprises a P-channel FET.

11. The level shifting device of claim 2 wherein the output circuit comprises:
a first field effect transistor (FET) having a source terminal coupled to the second logical zero reference voltage, a gate terminal coupled to the second internal signal, and a drain terminal;
a second FET having a source terminal coupled to the drain terminal of the first FET, a gate terminal coupled to the compliment of the input data signal, and a drain terminal coupled to the output data signal;
a third FET having a source terminal, a gate terminal coupled to the compliment of the input data signal, and a drain terminal coupled to the output data signal;
a fourth FET having a source terminal coupled to the second logical one reference voltage, a gate terminal coupled to the first internal signal, and a drain terminal coupled to the source terminal of the third FET.

12. The level shifting device of claim 11 wherein:
the first FET and the second FET comprise N-channel FETs; and
the third FET and the fourth FET comprise P-channel FETs.

13. The level shifting device of claim 11 wherein the output circuit further comprises:
a fifth FET having a source terminal coupled to the second logical zero reference voltage, a gate terminal coupled to the input data signal, and a drain coupled to the output data signal; and
a sixth FET having a source terminal coupled to the output data signal, a gate terminal coupled to the input data signal, and a drain coupled to the second logical one reference voltage.

14. The level shifting device of claim 13 wherein:
the fifth FET comprises a P-channel FET; and
the sixth FET comprises an N-channel FET.

15. A level shifting device for translating a logic level input data signal having a first voltage range to a logic level output data signal having a second voltage range, the level shifting device comprising:
a first power supply that provides the first voltage range and has a first logical one reference voltage and a first logical zero reference voltage; and
a second power supply that provides the second voltage range and has a second logical one reference voltage and a second logical zero reference voltage;
an input circuit configured to toggle, based on the input data signal and the output data signal, a first internal signal between the first logical zero reference voltage and the second logical one reference voltage, and to toggle, based on the input data signal and the output data signal, a second internal signal between the second logical zero reference voltage and the first logical one reference voltage; and
an output circuit configured to toggle, based on the first internal signal, the second internal signal, and a compliment of the input data signal, the output data signal between the second logical zero reference voltage and the second logical one reference voltage.

16. The level shifting device of claim 15 wherein the input circuit comprises:
a first field-effect transistor (FET) having a source terminal coupled to the first logical zero reference voltage, a gate terminal coupled to the input data signal, and a drain terminal coupled to the first internal signal;
a second FET having a source terminal, a gate terminal coupled to the input data signal, and a drain terminal coupled to the first internal signal;
a third FET having a source terminal coupled to the second logical one reference voltage, a gate terminal coupled to the output data signal, and a drain terminal coupled to the source terminal of the second FET;
a fourth FET having a source terminal coupled to the second logical zero reference voltage, a gate terminal coupled to the output data signal, and a drain terminal;
a fifth FET having a source terminal coupled to the drain terminal of the fourth FET, a gate terminal coupled to the input data signal, and a drain terminal coupled to the second internal signal; and
a sixth FET having a source terminal coupled to the first logical one reference voltage, a gate terminal coupled to the input data signal, and a drain terminal coupled to the second internal signal.

17. The level shifting device of claim 16 wherein the input circuit further comprises:
a seventh FET having a source terminal coupled to the first internal signal, a gate terminal coupled to the compliment of the input data signal, and a drain terminal coupled to the second logical one reference voltage; and
an eighth FET having a source terminal coupled to the second logical zero reference voltage, a gate terminal coupled to the compliment of the input data signal, and a drain coupled to the second internal signal.

18. The level shifting device of claim 15 wherein the output circuit comprises:
a first field effect transistor (FET) having a source terminal coupled to the second logical zero reference voltage, a gate terminal coupled to the second internal signal, and a drain terminal;
a second FET having a source terminal coupled to the drain terminal of the first FET, a gate terminal coupled to the compliment of the input data signal, and a drain terminal coupled to the output data signal;

a third FET having a source terminal, a gate terminal coupled to the compliment of the input data signal, and a drain terminal coupled to the output data signal; and a fourth FET having a source terminal coupled to the second logical one reference voltage, a gate terminal coupled to the first internal signal, and a drain terminal coupled to the source terminal of the third FET.

19. The level shifting device of claim 18 wherein the output circuit further comprises:

a fifth FET having a source terminal coupled to the second logical zero reference voltage, a gate terminal coupled to the input data signal, and a drain coupled to the output data signal; and a sixth FET having a source terminal coupled to the output data signal, a gate terminal coupled to the input data signal, and a drain coupled to the second logical one reference voltage.

20. A level shifting device for translating a logic level input data signal that transitions between a first logical one reference voltage and a first logical zero reference voltage to a logic level output data signal that transitions between a second logical one reference voltage and a second logical zero reference voltage, the level shifting device comprising:

a first field-effect transistor (FET) having a source terminal applied to the first logical zero reference voltage, a gate terminal applied to the input data signal, and a drain terminal applied to a first internal signal;

a second FET having a source terminal, a gate terminal applied to the input data signal, and a drain terminal applied to the first internal signal;

a third FET having a source terminal applied to the second logical one reference voltage, a gate terminal applied to the output data signal, and a drain terminal applied to the source terminal of the second FET;

a fourth FET having a source terminal applied to the second logical zero reference voltage, a gate terminal applied to the output data signal, and a drain terminal;

a fifth FET having a source terminal applied to the drain terminal of the fourth FET, a gate terminal applied to the input data signal, and a drain terminal applied to a second internal signal;

a sixth FET having a source terminal applied to the first logical one reference voltage, a gate terminal applied to the input data signal, and a drain terminal applied to the second internal signal;

a seventh FET having a source terminal applied to the second logical zero reference voltage, a gate terminal applied to the second internal signal, and a drain terminal;

an eighth FET having a source terminal applied to the drain terminal of the seventh FET, a gate terminal applied to a compliment of the input data signal, and a drain terminal applied to the output data signal;

a ninth FET having a source terminal, a gate terminal applied to the compliment of the input data signal, and a drain terminal applied to the output data signal; and a tenth FET having a source terminal applied to the second logical one reference voltage, a gate terminal applied to the first internal signal, and a drain terminal applied to the source terminal of the ninth FET.

* * * * *